United States Patent [19]
Kwon

[11] Patent Number: 5,940,323
[45] Date of Patent: Aug. 17, 1999

[54] ERASE CIRCUIT OF FLASH MEMORY DEVICE

[75] Inventor: Gyu Wan Kwon, Ichon-shi, Rep. of Korea

[73] Assignee: Hyundai Electronics Industries Co., Ltd., Kyungki-Do, Rep. of Korea

[21] Appl. No.: 08/975,236

[22] Filed: Nov. 21, 1997

[30] Foreign Application Priority Data

Nov. 22, 1996 [KR] Rep. of Korea ....................... 96-56412

[51] Int. Cl.$^6$ .................................................. G11C 16/00
[52] U.S. Cl. ................................ 365/185.22; 365/185.29; 365/185.33
[58] Field of Search ......................... 365/185.22, 185.33, 365/185.29

[56] References Cited

U.S. PATENT DOCUMENTS

| | | | |
|---|---|---|---|
| 5,594,689 | 1/1997 | Kato | 365/185.22 |
| 5,615,154 | 3/1997 | Yamada | 365/185.22 |
| 5,621,687 | 4/1997 | Doller | 365/185.22 |

*Primary Examiner*—Tan T. Nguyen
*Attorney, Agent, or Firm*—Scott C. Harris, Esq.

[57] ABSTRACT

This invention relates to an erase circuit of flash memory device comprising an erase verifying block unit outputting a final loop signal when an chip erasing operation is not performed within a predetermined time, a high voltage detection unit outputting a high voltage signal in response to an inverted chip erase signal, a buffer outputting an output enable signal in response to an inverted output enable signal, a control unit outputting a first to third select address signals in response to said final loop signal, inverted high voltage signal and output enable signal, an address counter unit outputting data in response to said first to third select address signals, an output multiplexor outputting one of a sense amp output signal, hardware flag and data read from said address counter unit in response to said first to third select address signals, sense amp control signal and hardware flag signal.

5 Claims, 6 Drawing Sheets

ERASE CIRCUIT OF FLASH MEMORY DEVICE

BACKGROUND OF THE INVENTION

1. Field of the Invention

The present invention relates to an erase circuit for a flash memory device, and more particularly, an erase circuit for a flash memory device which can verify an address of a fail erased memory cell when the erase verify operation is performed after erasing a memory cell.

2. Description of the Prior Arts

Generally, in erase operation of flash memory device, an erase verify operation is performed to verify whether erasing normally is done or not after performing the erase operation. In the prior art, in erase operation, the erase voltage is applied to a total memory cell or a memory cell which is divided into unit blocks. After performing the erase operation, an erase verify operation is performed, at this time, if an arbitrary memory cells would not be erased, that is, fail erased memory cell was generated, user didn't know the address of fail erased memory cell. In addition, it is difficult to design an erase verify circuit because the range of threshold voltage of erased memory cell is so wide when memory cell, particularly, chip is erased. And, user does not know whether the established erase verify scheme is right because the address of fail erased memory cells are not known.

SUMMARY OF THE INVENTION

The object of the present invention is to provide a erase circuit of a flash memory device which can verify the address of fail erased memory cell.

An erase circuit of flash memory device of the present invention comprises an erase verifying block unit outputting a final loop signal when an chip erasing operation is not performed within a predetermined time, a high voltage detection unit outputting a high voltage signal in response to an inverted chip erase signal, a buffer outputting an output enable signal in response to an inverted output enable signal, a control unit outputting a first to third select address signals in response to said final loop signal, inverted high voltage signal and output enable signal, an address counter unit outputting data in response to said first to third select address signals, and an output multiplexor outputting one of a sense amp output signal, hardware flag and data read from said address counter unit in response to said first to third select address signals, sense amp control signal and hardware flag signal.

The control unit comprises a first NAND gate to which an output enable signal, high voltage signal and final loop signal are input, a first inverter connected to said firsts NAND gate in series, a fifth inverter for shifting a phase of said final loop signal, first and second flip flops having a reset terminal to which an output signal of said fifth inverter is input and a clock terminal to which an output signal of said first inverter is input, and second to fourth NAND gates for combing output signals of said first and second flip flops, second to fourth inverters connected to said corresponded second to fourth NAND gates in series.

The address counter unit comprises an address counter in which data is memorized, a NMOS transistor sequentially outputting 8 bits address data selected from said address counter in response to first to third select address signals.

The output multiplexor comprises a first NMOS transistor group consisted of a plurality of NMOS transistors to which an output signal of said address counter unit is input, a second NMOS transistor group consisted of a plurality of NMOS transistors to which a sense amp output is input, and a third NMOS transistor group consisted of a plurality of NMOS transistors to which a hardware flag is input.

BRIEF DESCRIPTION OF THE DRAWINGS

Other objects and advantages of the present invention will be understood by the detailed explanation of the embodiment with reference to the accompanying drawings in which.

DETAILED DESCRIPTION OF THE INVENTION

Below, the present invention will be described with reference to accompanying drawings.

Figure 1:
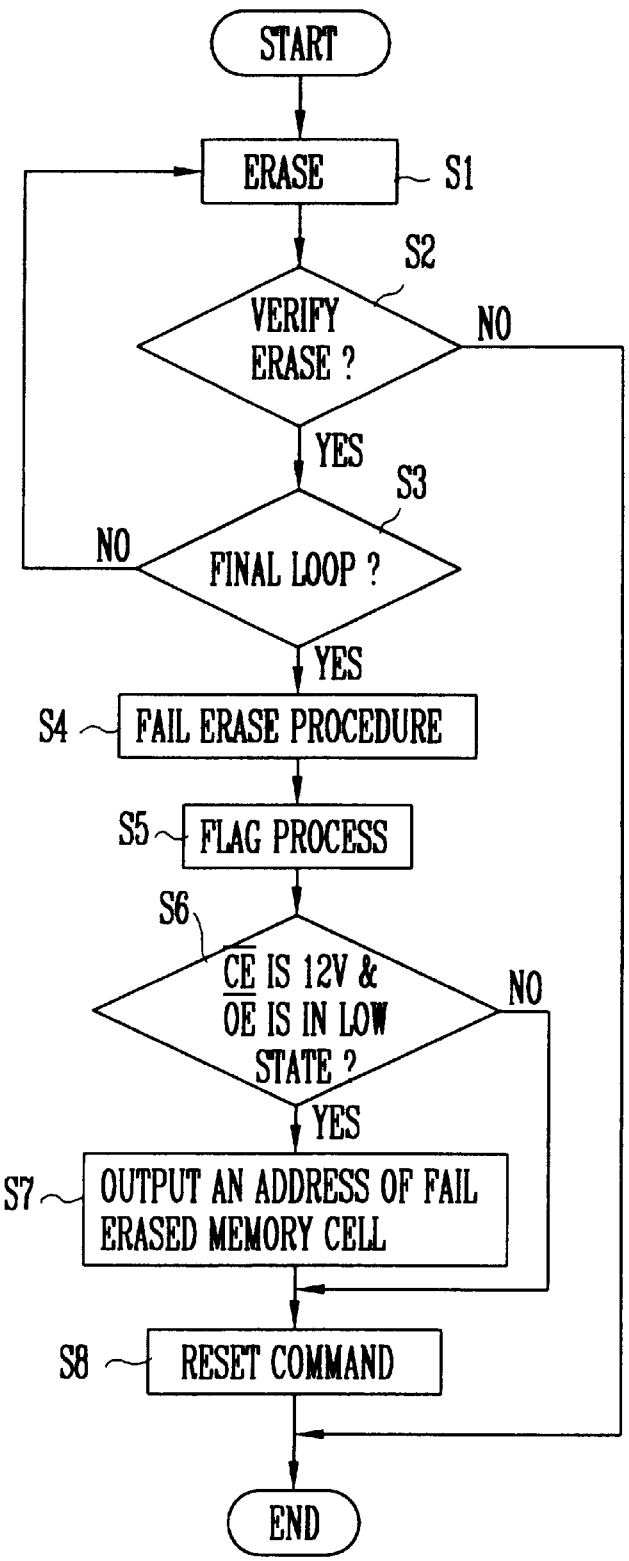
FIG. 1 is a flow chart for illustrating the erase operation of the flash memory device in accordance with the present invention.

FIG. 1 is a flow chart to explain an erase circuit of a flash memory device. In step S1, an entire memory cell or memory cell divided into blocks is erased. When the erase is finished, an erase verify operation is performed in step S2. Here, if fail erased memory cell does not exist, the erase operation is finished, if fail erased memory cell exists, step S3 is performed. In the step S3, an operation for determining whether a number of time for erase verifying exceeds predetermined final loop is performed. The number of time for erase verifying is not same as the predetermined final loop, the erase operation is performed again. If the number of time for erase verifying is same as the predetermined final loop, step S4 is performed.

In the step S4, fail erase procedure is executed, in next step S5, a signal for proclaiming a fail erased is generated. In step S6, if chip enable voltage is 12V and output enable signal is in low state, the address value of fail erased memory cell is read from an address counter (step S7), then the read address data is sent to input/output pad and a next step S8 is proceeded, In the step S8, a reset command is input to the address counter and a present mode is released and return to read/reset mode for receiving a next command. The cycle is finished in step S9.

Figure 2:
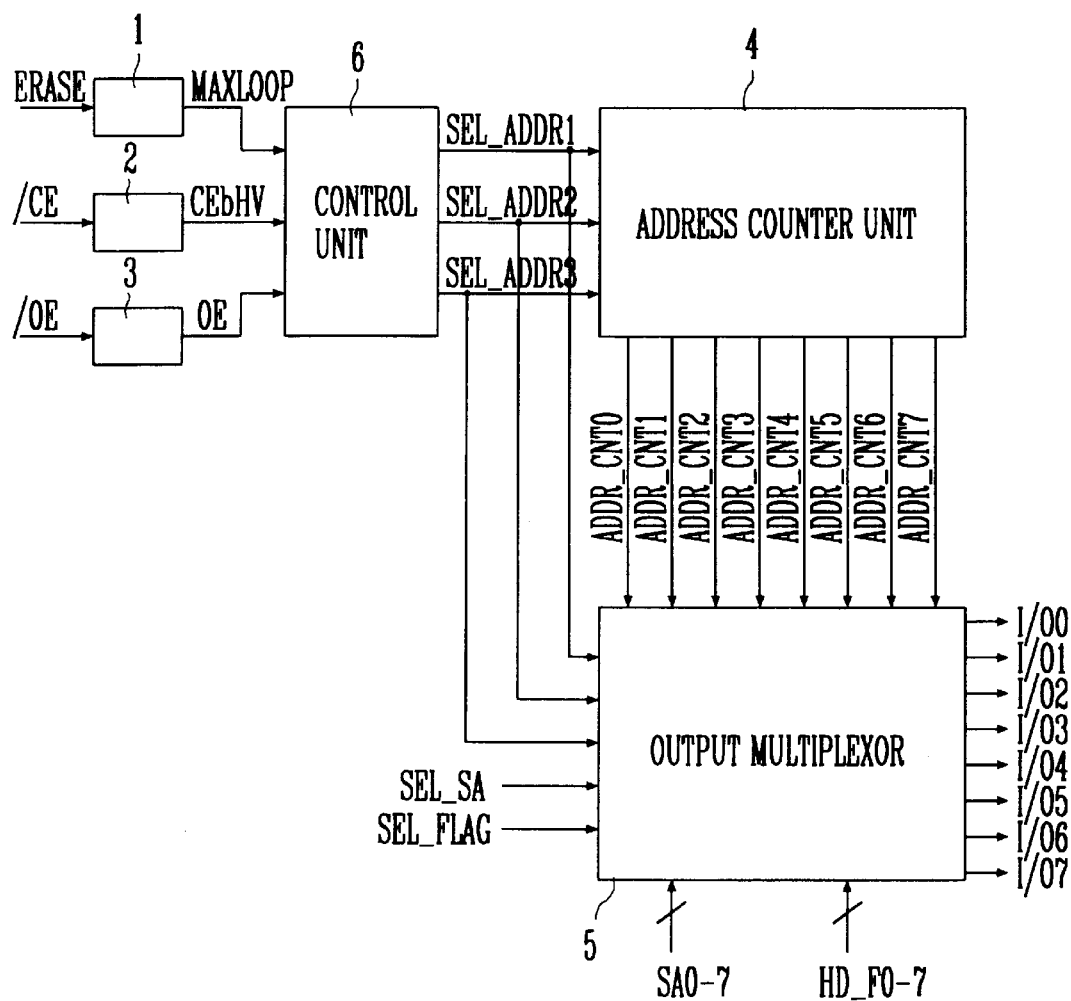
FIG. 2 is a block diagram for illustrating an erase circuit of flash memory device in accordance with the present invention.

FIG. 2 is a block diagram of an erase circuit of the flash memory device. An erase verify block 1, to which an erase signal is input, outputs a final loop signal MAXLOOP when an erase operation is not finished within a predetermined time. A high voltage detection unit 2 outputs a high voltage signal CEbHV in response to an inverted a chip erase signal /CE, a buffer 3, to which an inverted output enable signal /OE is input, outputs an output enable signal OE. A control unit 6, to which the final loop signal MAXLOOP, high voltage signal CEbHV and the output enable signal OE are input, outputs a first to third select address signals SEL_ADDR1 to SEL_ADDR3 and controls an address counter unit 4 and an output multiplexor 5 which will be described later. The address counter unit 4 transmits data to the output multiplexor 5 in response to the first to third select a address signals SEL_ADDR1 to SEL_ADDR3. The output multiplexor 5 outputs a sense amp output signals SA0 to SA7, hardware flags HD_F0 to HD_F7 and one of data read from the address counter unit 4 in response the first to third select address signals SEL_ADDR1 to SEL_ADDR3, a sense amp control signal SEL_SA and hardware flag SEL_FLAG.

Figure 3:
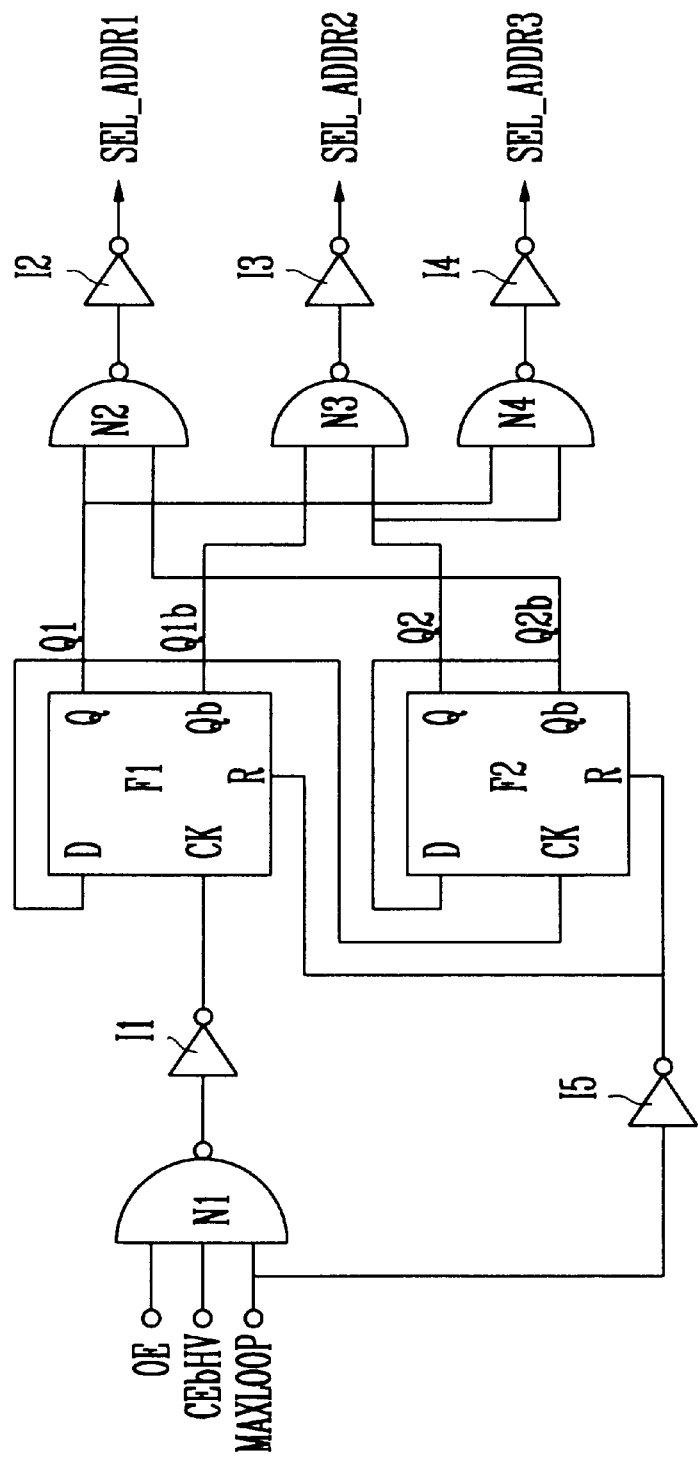
FIG. 3 is a detailed circuit of a control unit.

FIG. 3 is a detailed circuit of the control unit 6 as shown in FIG. 2, the control unit 6 comprises a first NAND gate N1 to which the output enable signal OE, the high voltage signal CEbHV and the final loop signal MAXLOOP are input, a first inverter I1 connected to the first NAND gate N1 in series, a fifth inverter I5 for inverting a phase of the final loop signal MAXLOOP, a first and second flip flops F1 and F2 to which an output signal of the fifth inverter I5 is input through a reset terminal R and an output signal of the first inverter I1 is input as a side clock signal CK.

The control unit 6 further comprises a second to fourth NAND gates N2 to N4 for combing signals output through output terminals Q1, Q1b and Q2, Q2b of the first and second flip flops F1 and F2, and a second to fourth inverters I2 to I4 connected to corresponded the second and fourth NAND gates N2 and N4 in series.

The first NAND gate N1 and the first inverter I1, to which the output enable signal OE, voltage signal CEbHV and final loop signal MAXLOOP are input, generate the clock signal CK of the first flip flop F1. The first and second flip flops F1 and F2 operate as a binary counter. If the final loop signal MAXLOOP is in low, a signal in low state is input to the reset terminal R. Therefore, a signal in low state is output through terminals Q1 and Q2 of the first and second flip flops F1 and F2. Here, at erase verification, if fail erased memory cell is generated, the final loop signal become high state, if an inverted chip erase signal is 12V, a mode is converted to mode for reading an output of the address counter unit 4. In this state, if the inverted output enable signal /OE is in low state, the output enable signal OE in high state is output through the output buffer 3 so that the clock signal CK is converted from low signal to high signal. According to the clock signal, an output of the terminal Q1 of the first flip flop F1 maintains in low state, however, an output of the terminal Q2 of the second flip flop F2 is converted from a low state to high state. If the inverted enable signal /OE is in high state, the output of the terminal Q1 of the first flip flop F1 is converted from low state to high state, the output of the terminal Q2 of the second flip flop F2 is converted from high state to low state. If the inverted output enable signal /OE is in high state, the output of the terminal Q1 of the first flip flop F1 is converted from high state to low state and the output of the terminal Q2 of the second flip flop F2 is converted from low state to high state.

Figure 4:
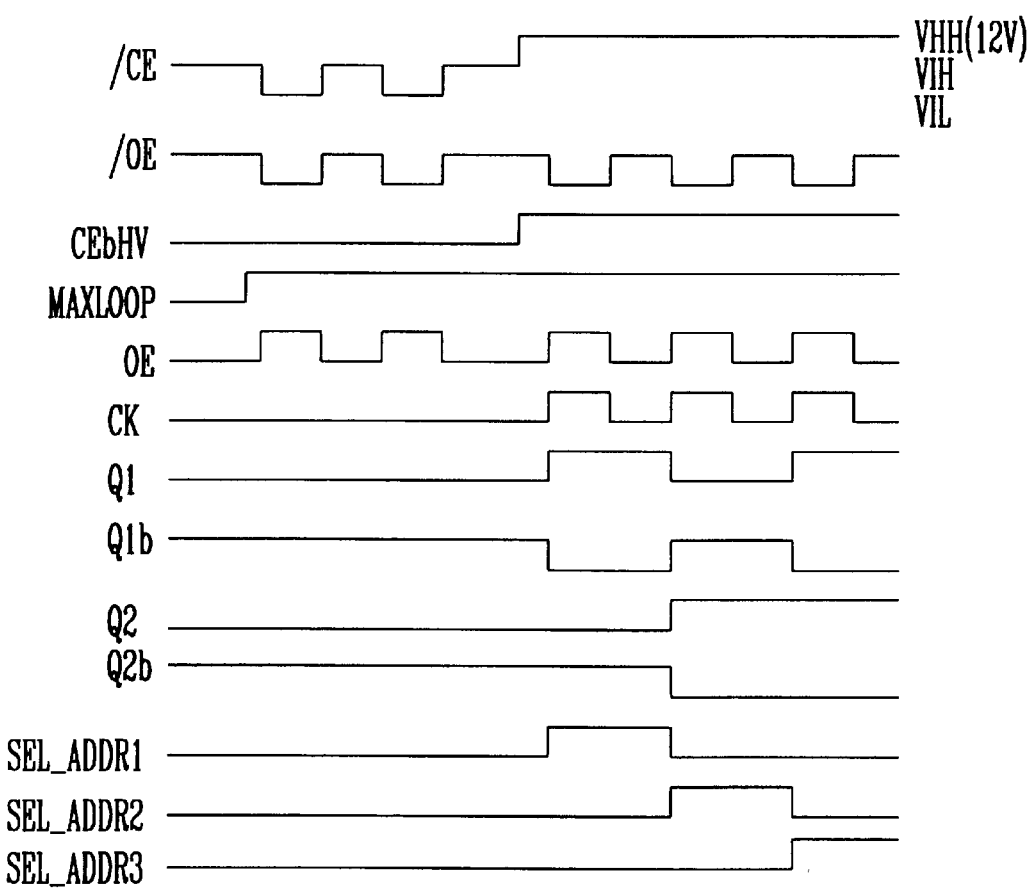
FIG. 4 is a waveform showing input signal and output signal in respect to time.

As shown in FIG. 4, these signals are inputted to the second to fourth NAND gates N2 to N4, and the first to third select address signals SEL_ADDR1 to SEL_ADDR3 are selected through the second to fourth inverters I2 to I4 connected to corresponded the second to fourth NAND gates N2 to N4 in series.

Figure 5:
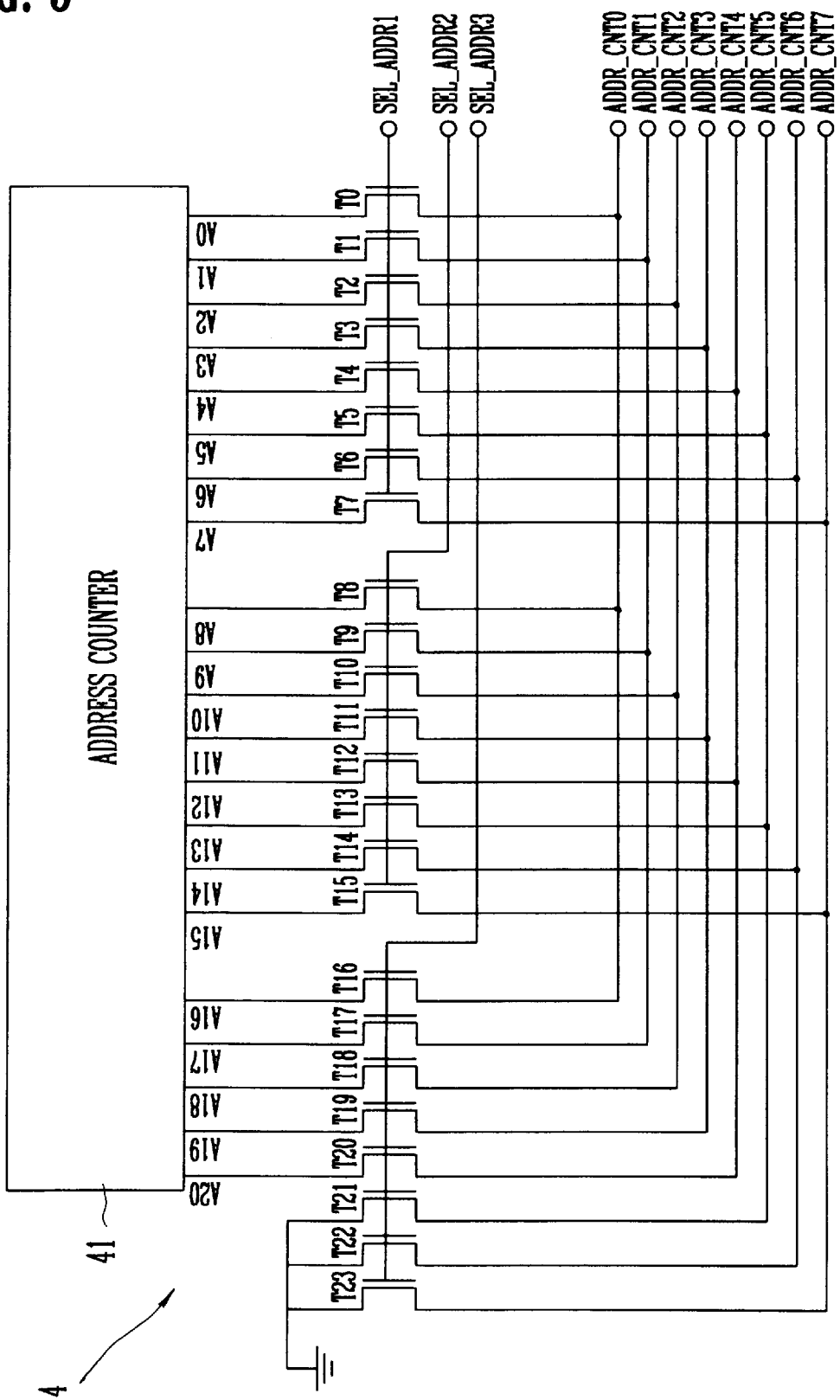
FIG. 5 is a detailed circuit of an address counter unit.

FIG. 5 is a detailed circuit of the address counter unit 4. The address counter unit 4 comprises an address counter 41 for memorizing data of flash memory of 2M×8 bit, NMOS transistors T0 to T23 sequentially outputting a 8 bit address data selected from the address counter 41 in response to the first to third select address signals SEL-ADDR1 to SEL_ADDR3. Sources of the NMOS transistors T0 to T7 are connected to the output pins A0 to A7 of the address counter 41, respectively, drains of the NMOS transistors T0 to T7 are connected to output lines ADDR_CNT0 to ADDR_CNT7, respectively. And gates of the NMOS transistors T0 to T7 are connected to a first select address pin.

Sources of the NMOS transistors T8 to T15 are connected to the output pins A8 to A15 of the address counter 41, respectively, drains of the NMOS transistors T8 to T15 are connected to output lines ADDR_CNT0 to ADDR_CNT7, respectively. And gates of the NMOS transistors T8 to T15 are connected to a second select address pin.

Sources of the NMOS transistors T16 to T20 are connected to the output pins A16 to A20 of the address counter 41, respectively, sources of the NMOS transistors T21 to T23 are grounded. Drains of the NMOS transistors T16 to T23 are connected to the output lines ADDR_CNT0 to ADDR_CNT7, respectively, gates of the NMOS transistors T16 to T23 are connected to a third select address pin.

In the address counter unit 4, 8 bit data is sequentially read through the output lines ADDR_CNT0 to ADDR_CNT7 from the address counter 41 in response to the select address signals SEL_ADDR1 to SEL_ADDR3 selected by the control unit 6. Here, if the third select address signal SEL_ADDR3 is in high state, the data corresponded to the output pins A16 to A20 of the address counter 41 are output to the output lines ADDR_CNT0 to ADDR_CNT4 through the NMOS transistors T16 to T20, and output lines ADDR_CNT5 to ADDR_CNT7 are grounded.

Figure 6:
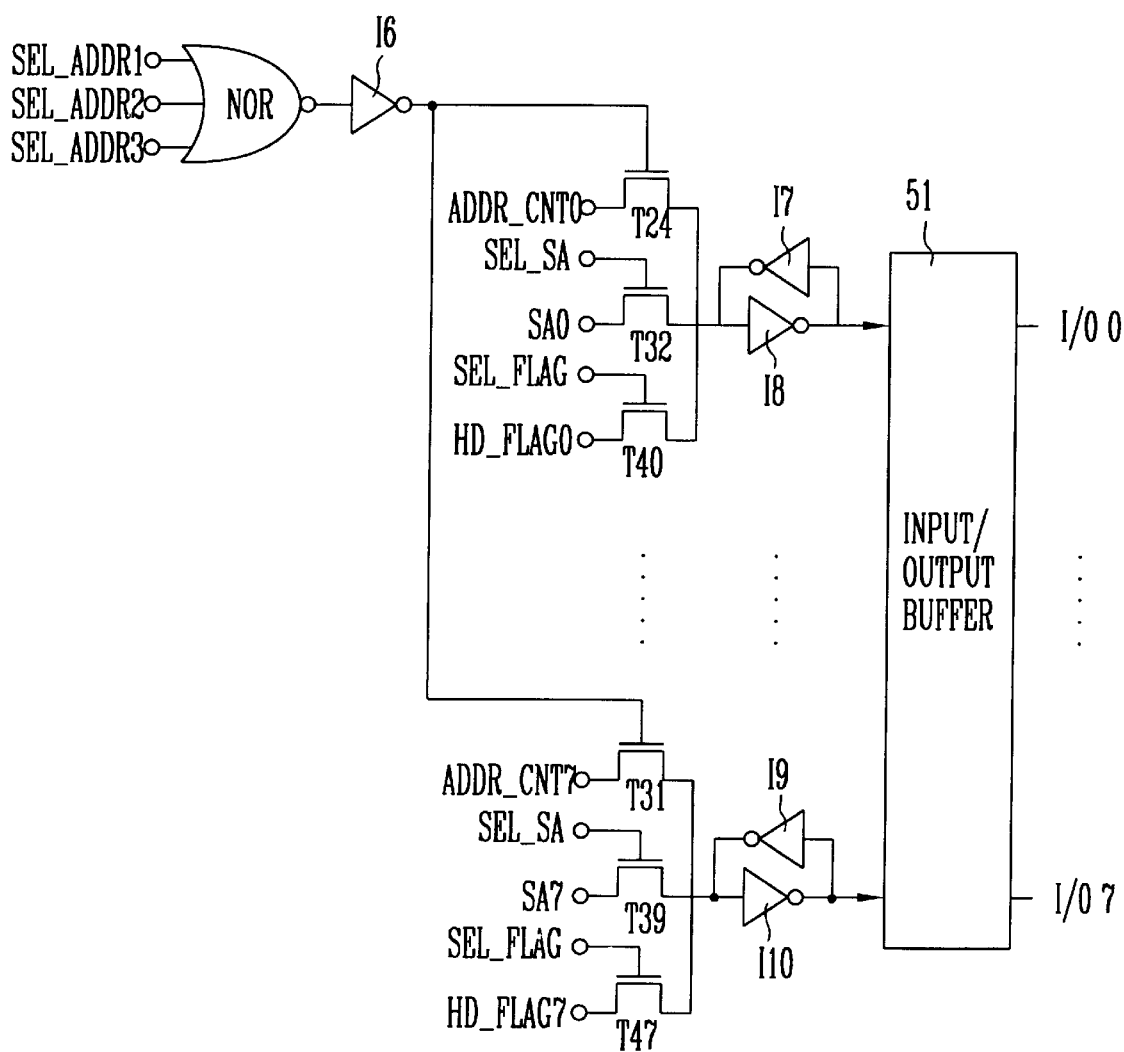
FIG. 6 is a detailed circuit of an output multiplexor.

FIG. 6 is a detailed circuit of the output multiplexor. The output multiplexor 5 comprises NMOS transistors T24 to T31 to which the data output from the address counter 41 are input through the output lines ADDR_CNT0 to ADDR_CNT7, NMOS transistors T32 to T39 to which sense amp outputs SA0 to SA7 are input, and NMOS transistors T40 to T47 to which hardware flags HD_F0 to HD_F7 are input.

Drains of the NMOS transistors T24, T32 and T40 to which an output signal which is output through the output line ADDR_CNT0 of the address counter unit 4, a sense amp output signal SA0 and hardware flag HD_F0 are inputted respectively, are connected in common. The NMOS transistors T24, T32 and T40 are connected to input/output buffer 51 through inverters I7 and I8 which are connected in latch type. Another output lines ADDR_CNT1 to ADDR_CNT7, sense amp outputs SA1 to SA7 and hardware flags HD_F1 to HD_F7 are connected in same type as described above.

Also, gates of NMOS transistors T24 to T31, which are connected to the output lines ADDR_CNT0 to ADDR_CNT7, are commonly connected to a NOR gate and an output line of a sixth inverter I6 connected to the NOR gate in series. Gates of NMOS transistor T32 to T39 to which the sense amp outputs SA0 to SA7 are input are connected a sense amp control signal SEL_SA pin in common, and gates of NMOS transistors T40 to T47 to which hardware flag signals HD_F0 to HD_F7 are input, are connected to hardware flag signal pin, in common.

Each of the NMOS transistors T24 to T31 sends the data which is output through the output lines ADDR_CNT0 to ADDR_CNT7 of the address counter unit 4 to data input/output pads I/O0 to I/O7 through the input/output buffer 51. If the first to third select address signal SEL_ADDR1 to SEL_ADDR3 are in high state, the NMOS transistors T24 to T31 are turned on.

Each of the NMOS transistors T32 to T39 sends the sense amp outputs SA0 to SA7 to the data input/output pads I/O0 to I/O7 through the input/output buffer 51. If the sense amp control signal SEL_SA is in high state, the NMOS transistors T32 to T39 are turned on.

Each of the NMOS transistors T40 to T47 sends the hardware signals HD_F0 to HD_F7 to the data input/out pads I/O0 to I/O0 to I/O7 through the input/output buffer 51. If the hardware flag signal SEL_FLAG is in high state, the NMOS transistors T40 to T47 are turned on.

If the fail erase verification among three modes is generated, the data which are read from the output line of the address counter unit 4 are output 8 bits at a time over three times through the data input/output pads I/O0 to I/O7.

According to the present invention, an address of fail erased memory cell is latched when an erase verify operation is performed after erasing a memory cell. A latched data is read through a data input/output pad so that the fail erased memory is searched and a threshold voltage can be measured. Therefore, the present invention has advantage of establishing easily the margin for erase verification in early architectural step.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. An erase circuit of flash memory device comprising:
   an erase verifying block unit outputting a final loop signal when a chip erasing operation is not performed within a predetermined time;
   a high voltage detection unit outputting a high voltage signal in response to an inverted chip erase signal;
   a buffer outputting an output enable signal in response to an inverted output enable signal
   a control unit outputting first to third select address signals in response to said final loop signal, said high voltage signal and said output enable signal;
   an address counter unit outputting data in response to said first to third select address signals; and
   an output multiplexor outputting one of a sense amp output signal, hardware flag and data read from said address counter unit in response to said first to third select address signals, sense amp control signal and hardware flag signal.

2. The erase circuit of flash memory device of claim 1, wherein said control unit comprises;
   a first NAND gate to which an output enable signal, high voltage signal and final loop signal are input;
   a first inverter connected to said firsts NAND gate in series;
   a fifth inverter for shifting a phase of said final loop signal;
   first and second flip flops having a reset terminal to which an output signal of said fifth inverter is input and a clock terminal to which an output signal of said first inverter is input; and
   second to fourth NAND gates for combing output signals of said first and second flip flops;
   second to fourth inverters connected to said corresponded second to fourth NAND gates in series.

3. The erase circuit of flash memory device of claim 1, wherein said address counter unit comprises;
   an address counter in which data is memorized;
   a NMOS transistor sequentially outputting 8 bits address data selected from said address counter in response to first to third select address signals.

4. The erase circuit of flash memory device of claim 1, wherein said output multiplexor comprises;
   a first NMOS transistor group consisted of a plurality of NMOS transistors to which an output signal of said address counter unit is input;
   a second NMOS transistor group consisted of a plurality of NMOS transistors to which a sense amp output is input; and
   a third NMOS transistor group consisted of a plurality of NMOS transistors to which a hardware flag is input.

5. The erase circuit of flash memory device of claim 4, wherein said each NMOS transistor of each NMOS transistor group has a gate to which an output signal, sense amp output and hardware flag are input and a drain connected to drain of other NMOS transistors in same group, said each NMOS transistor group is connected to an input/output buffer through two inverters connected to each other in latch type.

* * * * *